United States Patent [19]
Marinkovic
[11] 3,708,672
[45] Jan. 2, 1973

[54] SOLID STATE RELAY USING PHOTO-COUPLED ISOLATORS

[75] Inventor: Zoran Marinkovic, Framingham, Mass.
[73] Assignee: Honeywell Information Systems Inc., Waltham, Mass.

[22] Filed: March 29, 1971
[21] Appl. No.: 128,837

[52] U.S. Cl.............250/209, 250/214 R, 250/217 S, 307/252 A
[51] Int. Cl...............................................H01j 39/12
[58] Field of Search....250/211 J, 217 JS, 212 J, 208, 250/209, 214 R, 206; 307/117, 252 A, 252 J, 311

[56] References Cited

UNITED STATES PATENTS

| | | | |
|---|---|---|---|
| 3,355,600 | 11/1967 | Mapham | 250/217 S X |
| 3,523,189 | 8/1970 | Hansen et al. | 250/211 J |
| 3,486,029 | 12/1969 | Barrett et al. | 250/211 J |
| 3,443,106 | 5/1969 | Ebershoff et al. | 250/214 R |

OTHER PUBLICATIONS

G.E. SCR Manual; Copyright 1967 by the General Electric Co., pp. II, III; 289–300.

*Primary Examiner*—Walter Stolwein
*Attorney*—Ronald T. Reiling and Fred Jacob

[57] ABSTRACT

A solid state relay coupled to provide current flow to a load from a high voltage source provides high isolation between the relay's output terminals and an input control gate by means of a photo transistor coupled pair and a photo silicon controlled rectifier coupled pair connected in series circuit for response to the input control gate and by means of an output transistor responsive to the series circuit for providing a current path from the high voltage source through one output terminal, the collector-emitter path of the output transistor and to a load via the other output terminal.

12 Claims, 2 Drawing Figures

INVENTOR
ZORAN MARINKOVIC
BY
John S. Solakian
ATTORNEYS

SOLID STATE RELAY USING PHOTO-COUPLED ISOLATORS

BACKGROUND OF THE INVENTION

1. Field of the Invention

This invention relates to relays and more particularly to solid state relays utilized for switching high voltages.

2. Description of the Prior Art

Controlling, switching, and relaying information requires devices with extremely high isolation between input and output as well as fast response. Also, because the electronics industry is using more and more semiconductor circuits, there is an increasing demand for compatibility between devices.

Electro-optical devices have been developed which have very high input-to-output isolation, fast response speeds, and which are still compatible with transistor and integrated circuit devices. Some of these electro-optical devices have been developed by Monsanto Corporation and are described in Monsanto application information booklets entitled "Monsanto GaAs Lite Tips," Volumes 1 and 2, 1970. Briefly, these electro-optical devices are photo-coupled isolators with a gallium arsenide (GaAs)light emitting diode (LED) optically coupled to various types of detectors such as transistors and silicon controlled rectifiers. The LED is the control element which transmits photons (infrared light) via a light pipe to the detector. High voltage isolation and the elimination of signal feedback to the input, are additional inherent advantages to optically coupling interface circuitry. Driving the LED with forward current produces a photon density proportional to the input current. When the input signal varies, the corresponding variation produces a proportional change in the output of the detector.

In Volume 2 of the above mentioned booklets, there is shown a DTL and/or TTL logic gate interfaced with a transistor amplifier by means of an electro-optical device. However a shortcoming of such an arrangement is that a high voltage greater than the breakdown potential of the photo transistor coupled pair (approximately 30 Volts) cannot be switched at the output terminals. The apparatus of the present invention takes advantage of the high breakdown potential of a photo SCR coupled pair thereby providing the capability of switching high voltages.

It is therefore an object of this invention to provide a solid state relay having high isolation between its input and output and which is capable of switching high voltages.

SUMMARY OF THE INVENTION

The purposes and objects of this invention are satisfied by providing a photo transistor coupled pair and a photo silicon controlled rectifier (SCR) coupled pair which are responsive to a control signal applied to light emitting diodes of each device. In one embodiment the presence of a control signal turns on the photo transistor coupled pair and the photo SCR coupled pair which are coupled to turn on a further output transistor. The further output transistor is controlled via its base electrode whereas the collector and emitter electrodes thereof are coupled to terminals which in operation may be further connected to a high voltage source and load. When the further output transistor is turned on, a current path is provided from the high voltage source through the further transistor and to the load. The relay is turned off by initially turning off the photo transistor coupled pair.

BRIEF DESCRIPTION OF THE DRAWINGS

The advantage of the foregoing configuration of this invention will become more apparent upon reading the accompanying detailed description in connection with the figures in which.

DETAILED DESCRIPTION OF THE PREFERRED EMBODIMENTS

Figure 1:
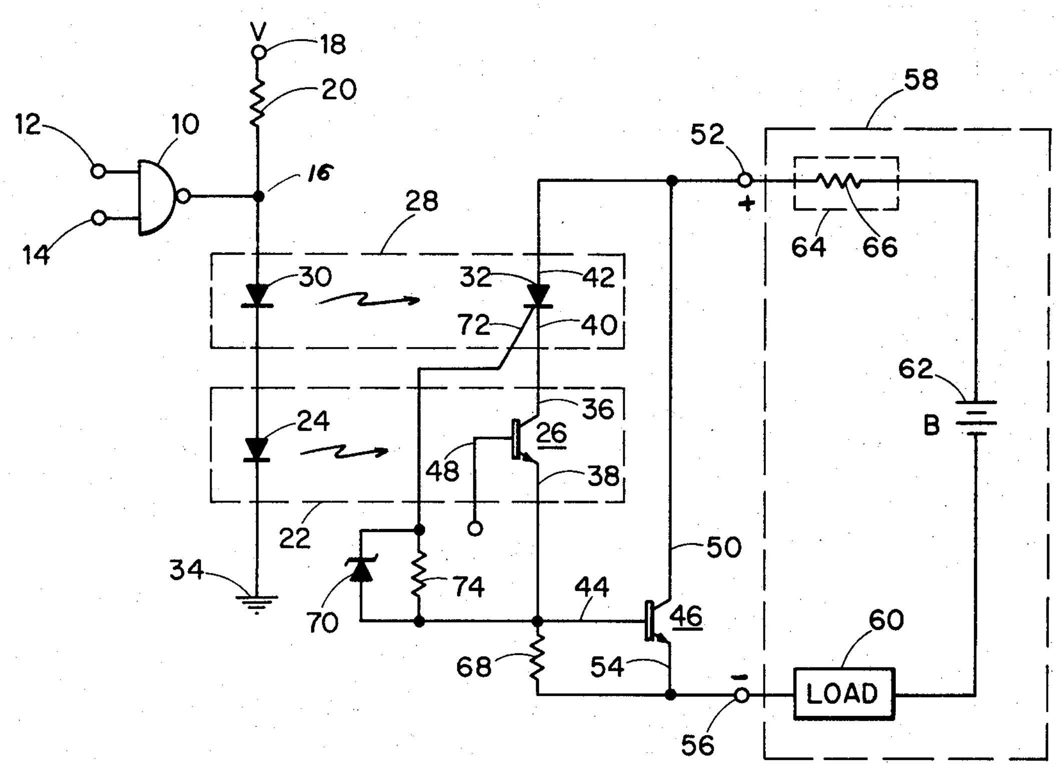
FIG. 1 is a circuit diagram illustrating one embodiment of the solid state relay in accordance with the principles of this invention.

In FIG. 1, an input control gate 10 is coupled by way of example to receive two input signals at terminals 12 and 14. The gate 10 may be for example of the DTL or TTL type and has an output coupled to point 16. A voltage supply, V, is coupled at terminal 18 through resistor 20 to point 16. A photo transistor coupled pair 22 which may be a Monsanto device number MCT2 is shown to include a light emitting diode (LED) 24 and a photo transistor 26. A photo silicon controlled rectifier (SCR) coupled pair 28 which may be a Monsanto device number MCS2 is shown to include an LED 30 and a photo SCR 32. The diodes 24 and 30 are connected in series between point 16 and circuit ground 34. The collecto~~6 and emitter 38 of photo transistor 26 are connected in series with the cathode 40 and anode 42 of photo SCR 32. Emitter 38 of photo transistor 26 is connected to base 44 of NPN transistor 46. The base 48 of photo transistor 26 is optically coupled to diode 24. Collector 50 of transistor 46 connects to the positive terminal 52 as does the anode 42 of photo SCR 32. Emitter 54 of transistor 46 connects to the negative terminal 56. An output circuit 58 is shown connected to terminals 52 and 56.

Circuit 58 may include a load 60, a voltage source 62 which provides a voltage B, and a current generator 64 which may be in the simplest case a resistor 66. Voltage B by way of example may be 150 volts dc. It will be seen that current from circuit 58 will flow through transistor 46 when transistor 46 is turned on. Also shown is a bias resistor 68 connected between base 44 and emitter 54 of transistor 46. A Zener diode 70 is shown connected between gate 72 of photo SCR 32 and emitter 38 of photo transistor 26. Diode 70 is used to prevent breakdown of photo transistor 26 during turn off of the relay. A resistor 74 is connected in parallel with diode 70 in order to keep gate 72 from being open circuited or floating.

In operation, with logical "1" input signals received at both input terminals 12 and 14, gate 10 is turned on, drawing current from supply, V, through resistor 20 and through the gate 10 output. Accordingly, diodes 30 and 24 and transistor 46 are turned off. A positive voltage B thus appears between terminals 52 and 56 and effectively appears across photo SCR 32. Accordingly, photo SCR 32 must be capable of withstanding a voltage greater than voltage B thereacross. Essentially no voltage appears across photo transistor 26 thereby allowing use of a low voltage photo transistor coupled pair 22. If the photo SCR coupled pair 28 were not used, photo transistor 26 of photo transistor coupled pair 22 would breakdown when voltage B from source 62 exceeds the collector emitter breakdown potential of photo transistor 26.

Further, when a logical "0" signal is present at either input terminals 12 and/or 14, gate 10 turns off and the current from supply V is directed through resistor 20, and diodes 30 and 24 to circuit ground 34. This turns on photo SCR 32 and photo transistor 26, thereby turning on transistor 46. When transistor 46 is turned on, the voltage between terminals 52 and 56 goes low since current from the current generator 64 flows through the collector-emitter path of transistor 46 and through load 60. Thus, the presence of a logical "0" signal at an input of gate 10 causes current flow through load 60.

With transistor 46 conducting, after applying logical "1" signals at both input terminals 12 and 14, gate 10 will turn on, removing current from both diodes 24 and 30. This causes photo transistor 26 to turn off. However, the photo SCR 32 is still on in a latched condition. Therefore, the voltage on collector 36 starts to increase toward the level of voltage B. The Zener diode 70 is used to prevent collector-emitter breakdown of photo transistor 26 and limits the voltage excursion to the Zener value. The current through the Zener is limited by the gain of transistor 46. Since photo transistor 26 is off, the anode-cathode path of photo SCR 32 is now open-circuited. After charge is evacuated from photo SCR 32, it turns off, turning off transistor 46 and removing current from the load 60. Thus with logical "1" signal present at both inputs of gate 10, no current is allowed to flow in load 60.

Figure 2:
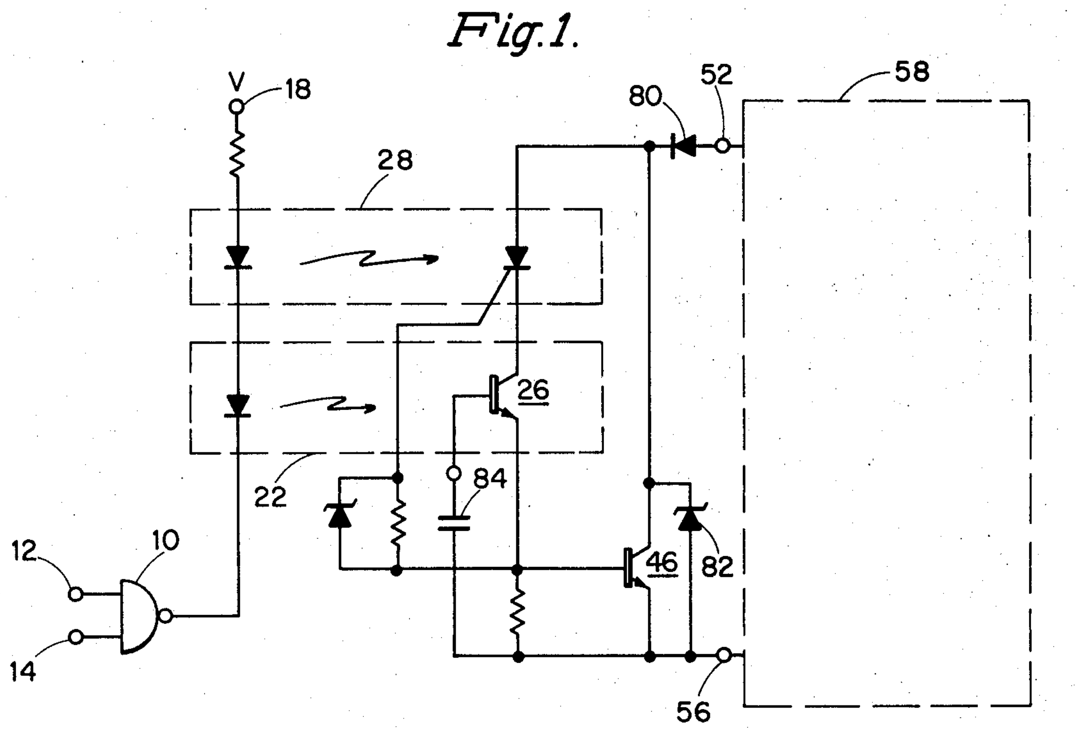
FIG. 2 is a circuit diagram illustrating another embodiment of the invention.

In FIG. 2, some modifications and enhancements to the circuit of FIG. 1 are shown. The input control gate 10 is shown connected to turn on the photo transistor coupled pair 22 and the photo SCR coupled pair 28 when logical "1" signals are present at all inputs of gate 10, thus causing current to flow in the output circuit 58. Applying a logical "0" signal at any input of gate 10 causes termination of current flow in the circuit 58. Further, a diode 80 may be used to protect the relay circuit and prevent operation thereof if the voltage source 62 is connected in a polarity opposite that shown in FIG. 1. A Zener diode 82 may be connected across the collector and emitter electrodes of transistor 46 to limit the voltage back swing when driving inductive loads. Another enhancement includes the connection of a capacitor 84 between the base of photo transistor 26 and negative terminal 56 to control the turn on of the relay circuit so that noise problems may be minimized.

It should be understood that the above-mentioned enhancements may be utilized either singly or in combination with the circuit shown in FIG. 1 and that other enhancements and modifications may be made without departing from the scope of the invention. For example, PNP rather than NPN transistors may have been utilized.

Having described the invention, what is claimed as new and secured by Letters Patent is:

1. A solid state relay having first and second output terminals, said relay comprising:

a. means for receiving a control signal;

b. first means including first light emitting means and photo transistor means optically coupled with said first light emitting means;

c. second means including second light emitting means and photo silicon controlled rectifier means optically coupled with said second light emitting means;

d. transistor means having base, collector and emitter electrodes, said collector and emitter electrodes coupled to said first and second output terminals;

e. means for coupling said first and second means in circuit;

f. means responsive to said control signal for turning on both said photo silicon controlled rectifier means and said photo transistor means;

g. means for coupling said transistor means base to said circuit of said first and second means; and h. means responsive to the turn on of said photo transistor means and said photo silicon controlled rectifier means for turning on said transistor means, whereby a current path is provided between said first and said second output terminals.

2. A solid state relay comprising:

a. means for receiving a control signal;

b. first means including a first light emitting diode and a photo transistor optically coupled with said first diode;

c. second means including a second light emitting diode and a photo silicon controlled rectifier optically coupled with said second diode;

d. said first and second diodes connected in circuit and to said means for receiving;

e. transistor means having base, collector and emitter electrodes, said collector and emitter electrodes coupled to positive and negative output terminals of said relay;

f. said photo silicon controlled rectifier and said photo transistor being coupled in series circuit, said series circuit connected between said positive terminal and said base electrode of said transistor means.

3. A relay as defined in claim 2 further comprising an output circuit connected between said output terminals, said output circuit including a current source and a load, said means for receiving coupled so that the presence of a control signal produces a current path from said current source through said transistor means and to said load.

4. A relay as defined in claim 2 wherein said photo transistor includes base, emitter and collector electrodes and wherein said relay further comprises Zener diode means connected between said photo transistor emitter and said photo silicon controlled rectifier for limiting the voltage excursion developed between said photo transistor collector and emitter electrodes.

5. A relay as defined in claim 4 wherein said first and second diodes are coupled in series circuit between said means for receiving and a first potential.

6. A relay as defined in claim 4 further comprising logic gate means having inputs coupled to receive input signals and having an output connected to said means for receiving.

7. A relay as defined in claim 6 further comprising capacitive means coupled between said photo transistor base electrode and said negative terminal.

8. A solid state relay comprising:

a. means for receiving a control signal;

b. photo transistor coupled pair means including a first light emitting diode and a photo transistor optically coupled for control by said first diode;

c. photo silicon controlled rectifier coupled pair means including a second light emitting diode and a photo silicon controlled rectifier (photo SCR) optically coupled for control by said second diode;

d. said first and second diodes connected in circuit and to said means for receiving;

e. positive and negative output terminals;

f. said photo SCR including gate, anode and cathode electrodes and said photo transistor including base, collector and emitter electrodes, said cathode coupled to said collector and said anode coupled to said positive output terminal; and g. transistor means having base, collector and emitter electrodes, said transistor means base and said photo transistor emitter coupled together at a first point, said first point coupled to said photo SCR gate electrode, said transistor means collector coupled to said positive output terminal, and said transistor means emitter coupled to said negative output terminal.

9. A relay as defined in claim 8 wherein said first and second diodes are connected in series circuit between said means for receiving and a first potential and further comprising:

a. first impedance means connected between said first point and said negative output terminal;

b. second impedance means connected in said coupling between said photo SCR gate electrode and said first point, said second impedance means including:

1. resistive means, and

2. Zener diode means connected in parallel with said resistive means.

10. A relay as defined in claim 8 further comprising a logic gate having inputs for receiving a plurality of input signals and having an output for producing said control signal, said output coupled to said means for receiving so that the presence of all of said plurality of input signals turns off said first and second diodes making said transistor means non-conductive.

11. A relay as defined in claim 8 further comprising a logic gate having inputs for receiving a plurality of input signals and having an output for producing said control signal, said output coupled to said means for receiving so that the presence of all of said plurality of input signals turns on said first and second diodes making said transistor means conductive.

12. A solid state relay comprising:

a. means for receiving a control signal;

b. first means including a first light emitting diode and a photo transistor optically coupled with said first diode;

c. second means including a second light emitting diode and a photo silicon controlled rectifier optically coupled with said second diode;

d. said first and second diodes connected in circuit and to said means for receiving;

e. transistor means; and wherein f. said photo silicon controlled rectifier and said photo transistor are coupled in circuit and to said transistor means for control of said transistor means.

* * * * *